(12) United States Patent
Kovacic et al.

(10) Patent No.: US 12,418,271 B2
(45) Date of Patent: Sep. 16, 2025

(54) RAISED AND RECESSED FRAMES ON BOTTOM AND TOP PLATES OF A BAW RESONATOR

(71) Applicant: SKYWORKS SOLUTIONS, INC., Irvine, CA (US)

(72) Inventors: Stephen Joseph Kovacic, Newport Beach, CA (US); Benjamin Paul Abbott, Irvine, CA (US)

(73) Assignee: SKYWORKS SOLUTIONS, INC., Irvine, CA (US)

( * ) Notice: Subject to any disclaimer, the term of this patent is extended or adjusted under 35 U.S.C. 154(b) by 272 days.

(21) Appl. No.: 17/659,031

(22) Filed: Apr. 13, 2022

(65) Prior Publication Data
US 2022/0337219 A1 Oct. 20, 2022

Related U.S. Application Data

(60) Provisional application No. 63/175,627, filed on Apr. 16, 2021.

(51) Int. Cl.
| | | |
|---|---|---|
| *H03H 9/13* | (2006.01) | |
| *H03H 3/04* | (2006.01) | |
| *H03H 9/17* | (2006.01) | |
| *H03H 9/56* | (2006.01) | |
| *H03H 9/60* | (2006.01) | |
| *H03H 3/02* | (2006.01) | |

(52) U.S. Cl.
CPC .............. *H03H 9/132* (2013.01); *H03H 3/04* (2013.01); *H03H 9/173* (2013.01); *H03H 9/564* (2013.01); *H03H 9/605* (2013.01); *H03H 2003/021* (2013.01); *H03H 2003/0457* (2013.01)

(58) Field of Classification Search
CPC ........ H03H 9/132; H03H 9/173; H03H 9/564; H03H 9/605
See application file for complete search history.

(56) References Cited

U.S. PATENT DOCUMENTS

| | | | |
|---|---|---|---|
| 7,187,253 B2 | 3/2007 | Sano et al. | |
| 9,991,871 B2 | 6/2018 | Zou et al. | |
| 2014/0203686 A1* | 7/2014 | Song | H10N 30/074 |
| | | | 310/326 |
| 2014/0354115 A1* | 12/2014 | Burak | H03H 9/175 |
| | | | 310/348 |
| 2019/0123708 A1* | 4/2019 | Choy | H03H 3/02 |
| 2020/0083861 A1* | 3/2020 | Matsuo | H03H 9/564 |
| 2020/0099359 A1* | 3/2020 | Shin | H03H 9/568 |
| 2020/0373901 A1 | 11/2020 | Liu et al. | |

* cited by examiner

*Primary Examiner* — Samuel S Outten
(74) *Attorney, Agent, or Firm* — Lando & Anastasi, LLP

(57) ABSTRACT

A film bulk acoustic wave resonator comprising a piezoelectric film having a central region defining a main active domain in which a main acoustic wave is generated during operation, an upper electrode disposed on a top surface of the piezoelectric film, a lower electrode disposed on a lower surface of the piezoelectric film, a dielectric material layer disposed on a lower surface of the lower electrode, and lower recessed frame regions disposed laterally on opposite sides of the central region, the lower recessed frame regions defined by regions of one of the dielectric material or of the lower electrode having a lesser thickness than the thickness of the one of the dielectric material layer or of the lower electrode in the central region.

17 Claims, 18 Drawing Sheets

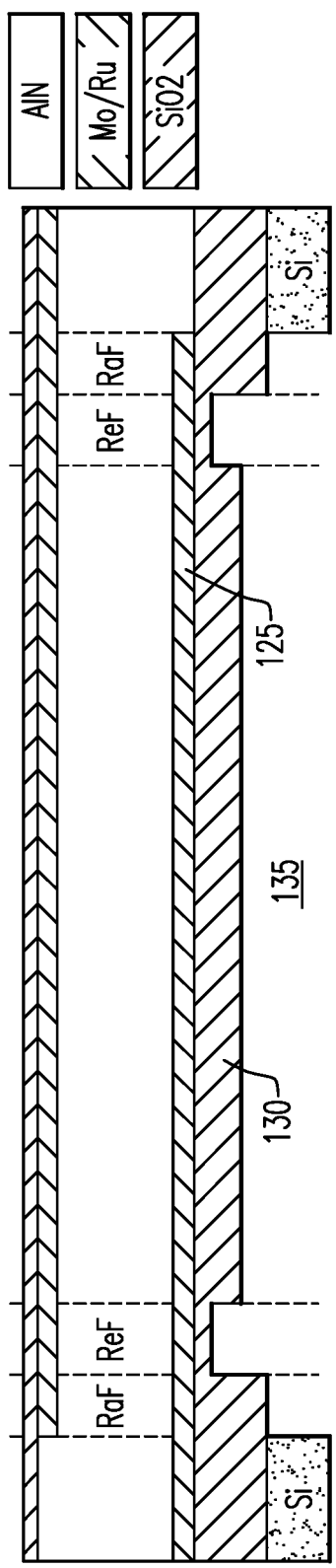
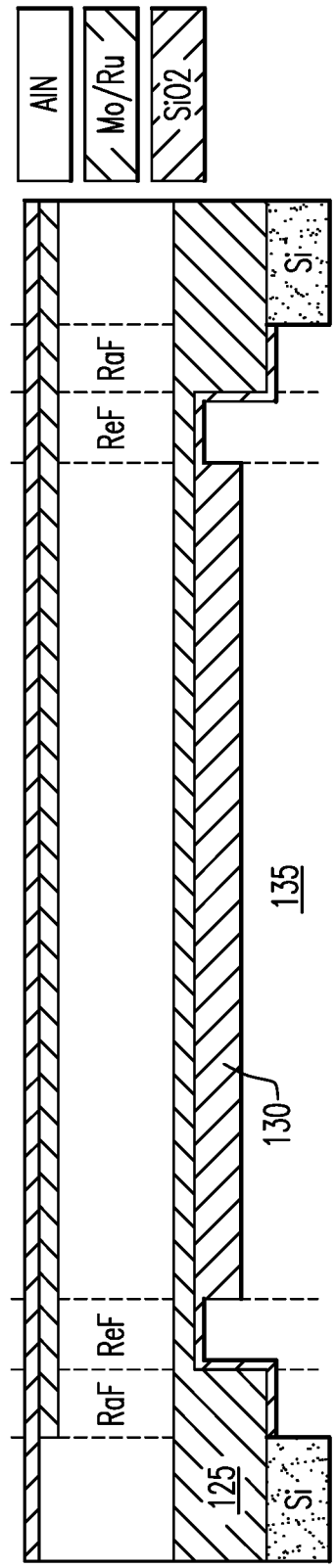
FIG.4A
FIG.4B

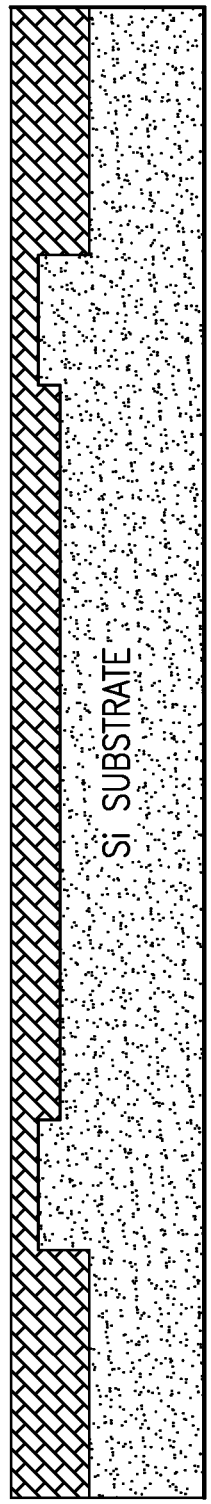
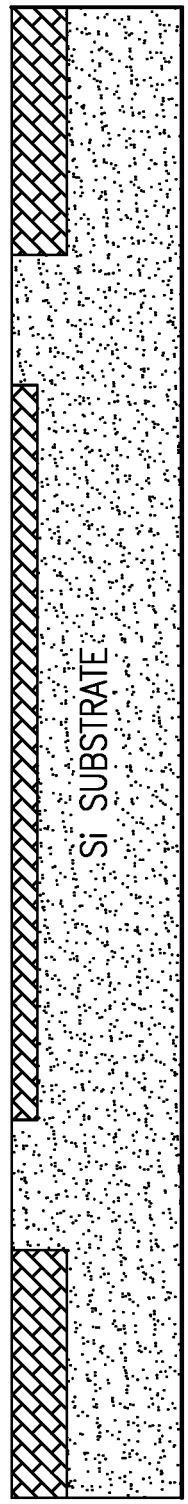
FIG.9D
FIG.9E

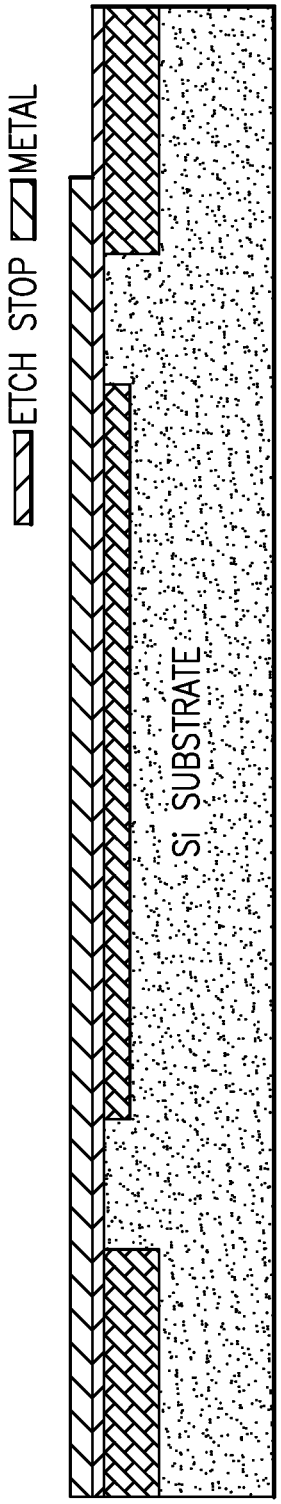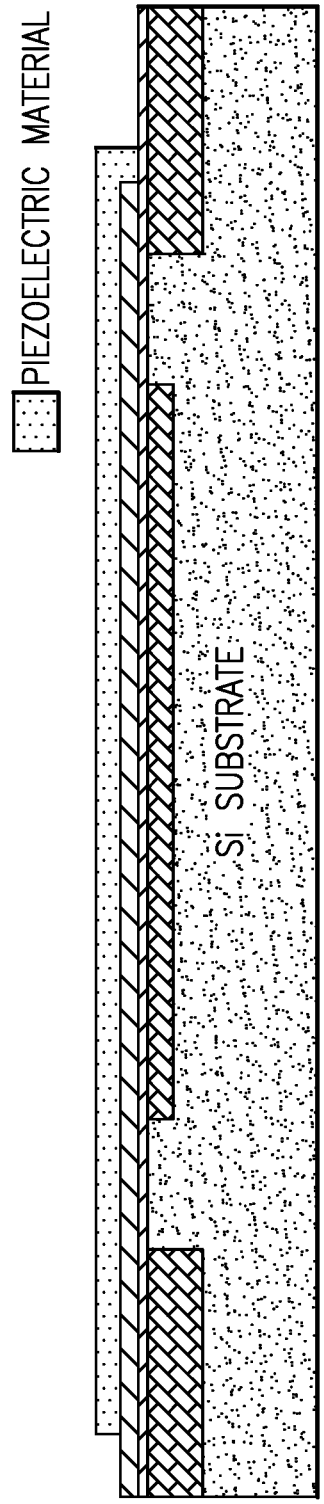
FIG.9F
FIG.9G

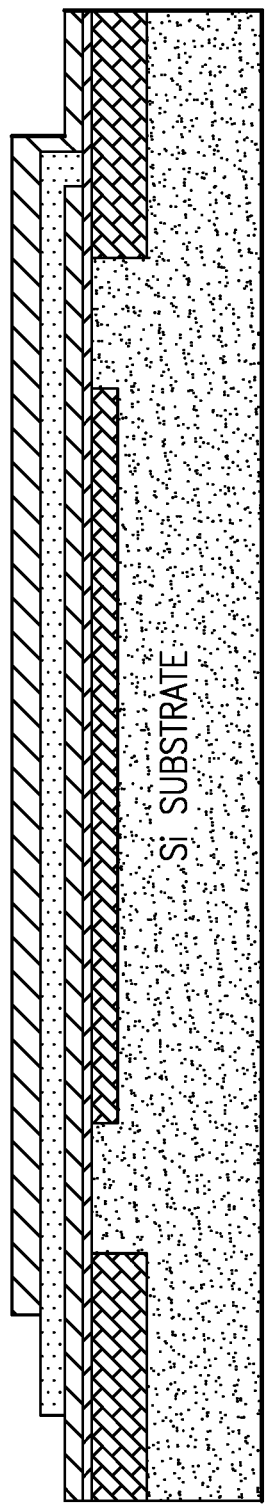

RAISED AND RECESSED FRAMES ON BOTTOM AND TOP PLATES OF A BAW RESONATOR

CROSS-REFERENCE TO RELATED APPLICATIONS

This application claims priority under 35 U.S.C. § 119(e) to U.S. Provisional Patent Application Ser. No. 63/175,627, titled "RAISED AND RECESSED FRAMES ON BOTTOM AND TOP PLATES OF A BAW RESONATOR," filed Apr. 16, 2021, the entire contents of which is incorporated by reference herein for all purposes.

BACKGROUND

Technical Field

Embodiments of this disclosure relate to acoustic wave devices, specifically film bulk acoustic wave resonators and electronic devices and modules including same.

Description of Related Technology

Acoustic wave devices, for example, bulk acoustic wave (BAW) devices may be utilized as components of filters in radio frequency electronic systems. For instance, filters in a radio frequency front end of a mobile phone can include acoustic wave filters. Two acoustic wave filters can be arranged as a duplexer.

SUMMARY

In accordance with one aspect, there is provided a film bulk acoustic wave resonator. The film bulk acoustic wave resonator comprises a piezoelectric film having a central region defining a main active domain in which a main acoustic wave is generated during operation, an upper electrode disposed on a top surface of the piezoelectric film, a lower electrode disposed on a lower surface of the piezoelectric film, a dielectric material layer disposed on a lower surface of the lower electrode, and lower recessed frame regions disposed laterally on opposite sides of the central region, the lower recessed frame regions defined by regions of one of the dielectric material or of the lower electrode having a lesser thickness than the thickness of the one of the dielectric material layer or of the lower electrode in the central region.

In some embodiments, the film bulk acoustic wave resonator further comprises lower raised frame regions disposed laterally on opposite sides of the recessed frame regions from the central region, the lower raised frame regions defined by regions of one of the dielectric material or of the lower electrode having a greater thickness than the thickness of the one of the dielectric material layer or of the lower electrode in the central region to improve performance of the film bulk acoustic wave resonator.

In some embodiments, the thickness of the lower electrode in the raised frame regions is greater than the thickness of the lower electrode in the lower recessed frame regions.

In some embodiments, the thickness of the lower electrode in the lower raised frame regions is greater than the thickness of the lower electrode in the central region.

In some embodiments, the thickness of the dielectric material layer in the lower recessed frame regions is less than the thickness of the dielectric material layer in the central region.

In some embodiments, the thickness of the dielectric material layer in the lower raised frame regions is less than the thickness of the dielectric material layer in the central region.

In some embodiments, the thickness of the lower electrode in the central region is greater than the thickness of the lower electrode in the lower recessed frame regions.

In some embodiments, a width of the raised frame region is linearly apodized across a width of the film bulk acoustic wave resonator in a plane defined by the top surface of the piezoelectric film.

In some embodiments, apodization of the raised frame region is between first and second widths on both of a first side of the film bulk acoustic wave resonator and on a second side of the film bulk acoustic wave resonator opposite the first side.

In some embodiments, apodization of the raised frame region is between first and second widths on a first side of the film bulk acoustic wave resonator and between third and fourth widths on a second side of the film bulk acoustic wave resonator opposite the first side, at least one of the third and fourth widths being different from each of the first and second widths.

In some embodiments, a width of the recessed frame region is linearly apodized across a width of the film bulk acoustic wave resonator in a plane defined by the top surface of the piezoelectric film.

In some embodiments, apodization of the recessed frame region is between first and second widths on both of a first side of the film bulk acoustic wave resonator and on a second side of the film bulk acoustic wave resonator opposite the first side.

In some embodiments, apodization of the recessed frame region is between first and second widths on a first side of the film bulk acoustic wave resonator and between third and fourth widths on a second side of the film bulk acoustic wave resonator opposite the first side, at least one of the third and fourth widths being different from each of the first and second widths.

In some embodiments, the piezoelectric film is substantially planar and the central region is disposed over a cavity defined in a support substrate.

In some embodiments, the lower recessed frame regions and lower raised frame regions are also disposed over the cavity defined in the support substrate.

In some embodiments, the upper electrode is thicker than the lower electrode.

In some embodiments, the film bulk acoustic wave resonator further comprises an upper dielectric film disposed on an upper surface of the upper electrode.

In some embodiments, the film bulk acoustic wave resonator further comprises upper recessed frame regions including regions of the upper dielectric material having a lesser thickness than the thickness of the upper dielectric material in the central region.

In some embodiments, the film bulk acoustic wave resonator further comprises upper raised frame regions including regions of the upper dielectric material having a greater thickness than the thickness of the upper dielectric material in the central region.

In some embodiments, the film bulk acoustic wave resonator further comprises upper recessed frame regions including regions of the upper electrode having a lesser thickness than the thickness of the upper electrode in the central region.

In some embodiments, the film bulk acoustic wave resonator further comprises upper raised frame regions including regions of the upper electrode having a greater thickness than the thickness of the upper electrode in the central region.

In some embodiments, the film bulk acoustic wave resonator has a mesa structure.

In some embodiments, an upper dielectric film disposed on an upper surface of the upper electrode, and upper recessed frame regions including regions of the upper dielectric material having a lesser thickness than the thickness of the upper dielectric material in the central region.

In some embodiments, an upper dielectric film disposed on an upper surface of the upper electrode, and upper raised frame regions including regions of the upper dielectric material having a greater thickness than the thickness of the upper dielectric material in the central region.

In some embodiments, the film bulk acoustic wave resonator is included in a radio frequency filter.

In some embodiments, the film bulk acoustic wave resonator is included in an electronic device module.

In some embodiments, the film bulk acoustic wave resonator is included in an electronic device.

In accordance with another aspect, there is provided a film bulk acoustic wave resonator. The film bulk acoustic wave resonator comprises a piezoelectric film having a central region defining a main active domain in which a main acoustic wave is generated during operation, an upper electrode disposed on a top surface of the piezoelectric film, a lower electrode disposed on a lower surface of the piezoelectric film, a dielectric material layer disposed on a lower surface of the lower electrode, and lower raised frame regions disposed laterally on opposite sides of the recessed frame regions from the central region, the lower raised frame regions defined by regions of one of the dielectric material or of the lower electrode having a greater thickness than the thickness of the one of the dielectric material layer or of the lower electrode in the central region to improve performance of the film bulk acoustic wave resonator.

In some embodiments, the film bulk acoustic wave resonator further comprises lower recessed frame regions disposed laterally on opposite sides of the central region, the lower recessed frame regions defined by regions of one of the dielectric material or of the lower electrode having a lesser thickness than the thickness of the one of the dielectric material layer or of the lower electrode in the central region.

BRIEF DESCRIPTION OF THE DRAWINGS

Embodiments of this disclosure will now be described, by way of non-limiting example, with reference to the accompanying drawings.

FIG. 4A illustrates a film bulk acoustic wave resonator configuration in which the recessed and raised frame regions are defined by changes in thickness of dielectric material on the bottom of the piezoelectric film;

FIG. 4B illustrates a film bulk acoustic wave resonator configuration in which the recessed and raised frame regions are defined by changes in thickness of the dielectric material and the electrode material on the bottom of the piezoelectric film;

FIGS. 9A-9I illustrate a process flow for forming a film bulk acoustic wave resonator in accordance with an embodiment disclosed herein;

DETAILED DESCRIPTION OF CERTAIN EMBODIMENTS

Figure 1:
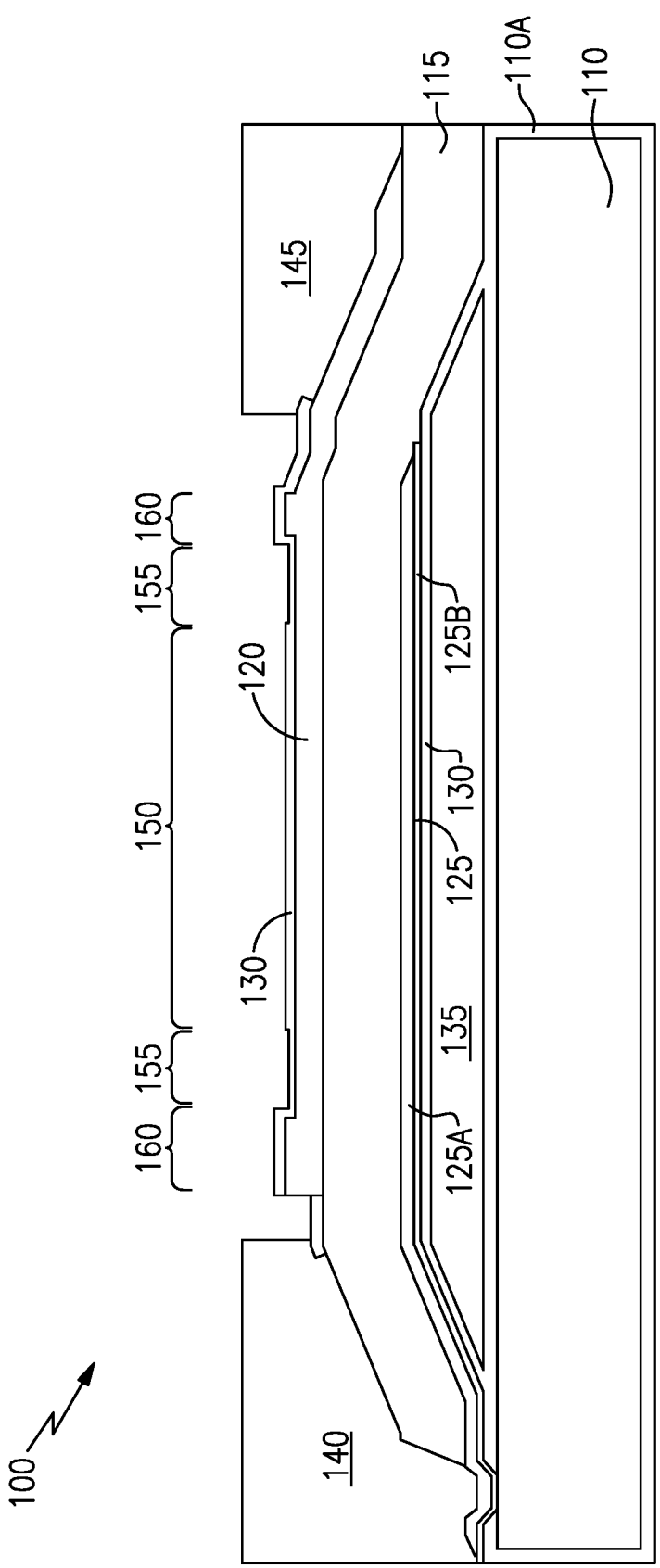
FIG. 1 is a cross-sectional view of an example of film bulk acoustic wave resonator.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale and that some intermediate materials or layers are not illustrated. Moreover, it will be understood that certain embodiments can include more elements than illustrated in a drawing and/or a subset of the elements illustrated in a drawing. Further, some embodiments can incorporate any suitable combination of features from two or more drawings.

Film bulk acoustic wave resonators (FBARs) are a form of bulk acoustic wave resonator that generally includes a film of piezoelectric material sandwiched between a top and a bottom electrode and suspended over a cavity that allows for the film of piezoelectric material to vibrate. A signal applied across the top and bottom electrodes causes an acoustic wave to be generated in and travel through the film of piezoelectric material. A FBAR exhibits a frequency response to applied signals with a resonance peak determined by a thickness of the film of piezoelectric material. Ideally, the only acoustic wave that would be generated in a FBAR is a main acoustic wave that would travel through the film of piezoelectric material in a direction perpendicular to layers of conducting material forming the top and bottom electrodes, sometimes referred to as "piston mode" operation. The piezoelectric material of a FBAR, however, typically has a non-zero Poisson's ratio. Compression and relaxation of the piezoelectric material associated with passage of the main acoustic wave may thus cause compression and relaxation of the piezoelectric material in a direction perpendicular to the direction of propagation of the main acoustic wave. The compression and relaxation of the piezoelectric material in the direction perpendicular to the direction of propagation of the main acoustic wave may generate transverse acoustic waves that travel perpendicular to the main acoustic wave (parallel to the surfaces of the electrode films) through the piezoelectric material. The transverse acoustic waves may be reflected back into an area in which the main acoustic wave propagates and may induce spurious acoustic waves travelling in the same direction as the main acoustic wave. These spurious acoustic waves may degrade the frequency response of the FBAR from what is expected or from what is intended and are generally considered undesirable.

FIG. 1 is cross-sectional view of an example of a FBAR, indicated generally at 100, having what may be referred to as a mesa structure. The FBAR 100 is disposed on a substrate 110, for example, a silicon substrate that may include a dielectric surface layer 110A of, for example, silicon dioxide. The FBAR 100 includes a layer or film of piezoelectric material 115, for example, aluminum nitride (AlN). A top electrode 120 is disposed on top of a portion of the layer or film of piezoelectric material 115 and a bottom electrode 125 is disposed on the bottom of a portion of the layer or film of piezoelectric material 115. The top electrode 120 may be formed of, for example, ruthenium (Ru), molybdenum (Mo), or a Ru/Mo alloy. The bottom electrode 125 may include a layer 125A of Ru (or Mo or Ru/Mo alloy) disposed in contact with the bottom of the portion of the layer or film of piezoelectric material 115 and a layer 125B of titanium (Ti) disposed on a lower side of the layer 125A of Ru opposite a side of the layer 125A of Ru in contact with the bottom of the portion of the layer or film of piezoelectric material 115. Each of the top electrode 120 and the bottom electrode 125 may be covered with a layer of dielectric material 130, for example, silicon dioxide. A cavity 135 is defined beneath the layer of dielectric material 130 covering the bottom electrode 125 and the surface layer 110A of the substrate 110. A bottom electrical contact 140 formed of, for example, copper may make electrical connection with the bottom electrode 125 and a top electrical contact 145 formed of, for example, copper may make electrical connection with the top electrode 120.

The FBAR 100 may include a central region 150 including a main active domain in the layer or film of piezoelectric material 115 in which a main acoustic wave is excited during operation. The central region 150 may also be referred to as the active area of the FBAR 100. The central region may have a width of, for example, between about 20 μm and about 100 μm. A recessed frame region or regions 155 may bound and define the lateral extent of the central region 150. The recessed frame regions may have a width of, for example, about 1 μm. The recessed frame region(s) 155 may be defined by areas that have a thinner layer of dielectric material 130 on top of the top electrode 120 than in the central region 150. The dielectric material layer 130 in the recessed frame region(s) 155 may be from about 10 nm to about 100 nm thinner than the dielectric material layer 130 in the central region 150. The difference in thickness of the dielectric material in the recessed frame region(s) 155 vs. in the central region 150 may cause the resonant frequency of the device in the recessed frame region(s) 155 to be between about 5 MHz to about 50 MHz higher than the resonant frequency of the device in the central region 150. In some embodiments, the thickness of the dielectric material layer 130 in the central region 150 may be about 200 nm to about 300 nm and the thickness of the dielectric material layer 130 in the recessed frame region(s) 155 may be about 100 nm. The dielectric film 300 in the recessed frame region(s) 155 is typically etched during manufacturing to achieve a desired difference in acoustic velocity between the central region 150 and the recessed frame region(s) 155. Accordingly, the dielectric film 300 initially deposited in both the central region 150 and recessed frame region(s) 155 is deposited with a sufficient thickness that allows for etching of sufficient dielectric film 300 in the recessed frame region(s) 155 to achieve a desired difference in thickness of the dielectric film 300 in the central region 150 and recessed frame region(s) 155 to achieve a desired acoustic velocity difference between these regions.

A raised frame region or regions 160 may be defined on an opposite side of the recessed frame region(s) 155 from the central region 150 and may directly abut the outside edge(s) of the recessed frame region(s) 155. The raised frame regions may have widths of, for example, about 1 μm. The raised frame region(s) 160 may be defined by areas where the top electrode 120 is thicker than in the central region 150 and in the recessed frame region(s) 155. The top electrode 120 may have the same thickness in the central region 150 and in the recessed frame region(s) 155 but a greater thickness in the raised frame region(s) 160. The top electrode 120 may be between about 50 nm and about 500 nm thicker in the raised frame region(s) 160 than in the central region 150 and/or in the recessed frame region(s) 155. In some embodiments the thickness of the top electrode in the central region may be between 50 and 500 nm. In other embodiments, the top electrode 120 may have the same thickness in the central region 150, the recessed frame region(s) 155, and the raised frame region(s) 160, and the raised frame may be defined by a thicker layer of dielectric film 300 in the raised frame regions than in the central region 150 and recessed frame region(s) 155.

The recessed frame region(s) 155 and the raised frame region(s) 160 may contribute to dissipation or scattering of transverse acoustic waves generated in the FBAR 100 during operation and/or may reflect transverse waves propagating outside of the recessed frame region(s) 155 and the raised frame region(s) 160 and prevent these transverse acoustic waves from entering the central region and inducing spurious signals in the main active domain region of the FBAR. Without being bound to a particular theory, it is believed that due to the thinner layer of dielectric material 130 on top of the top electrode 120 in the recessed frame region(s) 155, the recessed frame region(s) 155 may exhibit a higher velocity of propagation of acoustic waves than the central region 150. Conversely, due to the increased thickness and mass of the top electrode 120 in the raised frame region(s) 160, the raised frame regions(s) 160 may exhibit a lower velocity of propagation of acoustic waves than the central region 150 and a lower velocity of propagation of acoustic waves than the recessed frame region(s) 155. The discontinuity in acoustic wave velocity between the recessed frame region(s) 155 and the raised frame region(s) 160 creates a barrier that scatters, suppresses, and/or reflects transverse acoustic waves.

Figure 2:
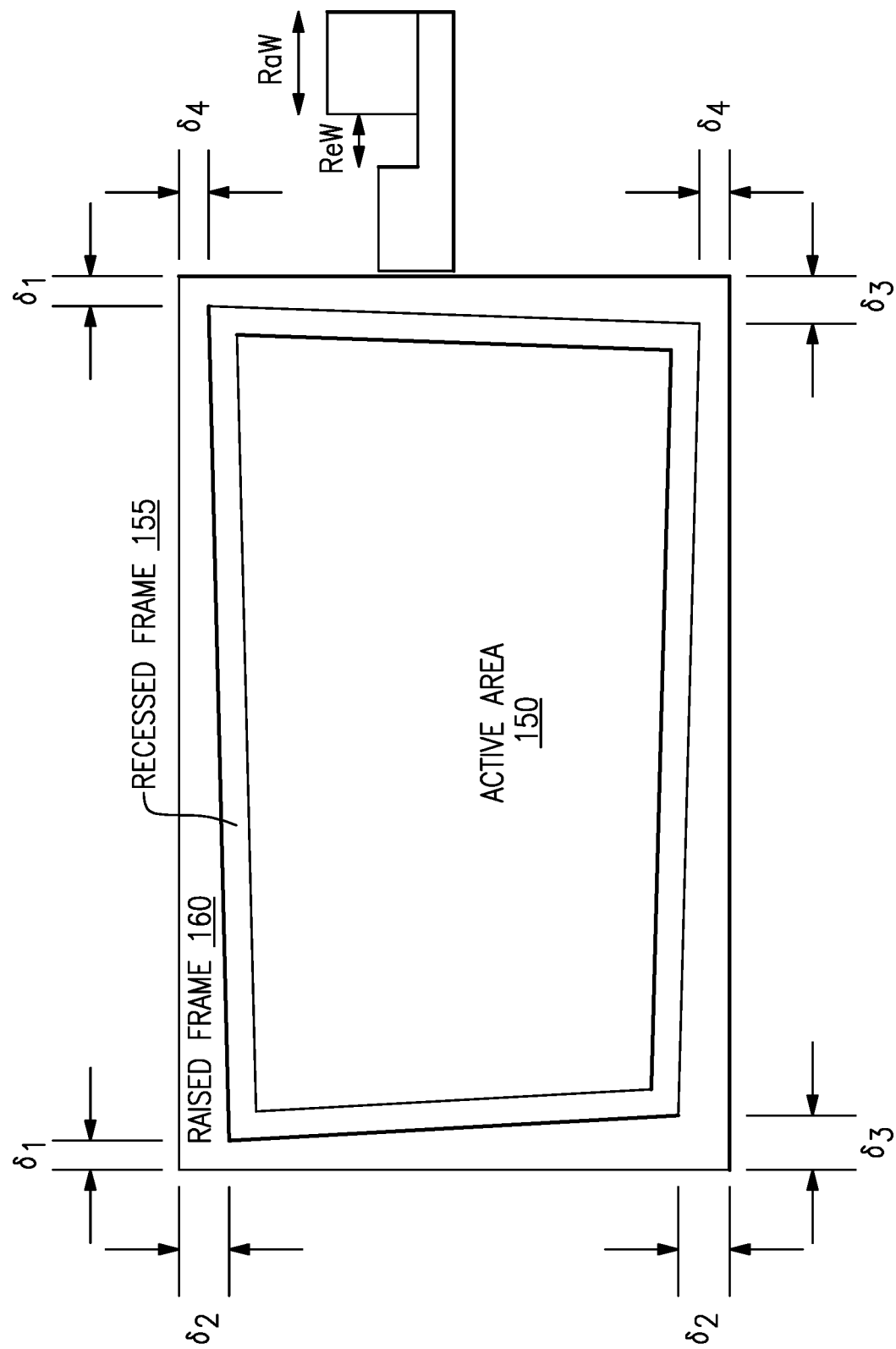
FIG. 2 is a schematic plan view of a film bulk acoustic wave resonator having linearly apodized raised frame widths.

In some embodiments, to prevent or reduce the tendency of transverse acoustic waves to form or to resonate and form standing waves in the central region/active area 150 of an FBAR, the raised frame width (RaW) may be linearly apodized between two values at each corner or side of the resonator. The discrete RaW may take on four values to provide a diversity of responses along each edge. FIG. 2 provides an example of this configuration.

The border and overall shape of the FBAR as a whole may be rectangular or square, but the raised frame 160 may have different widths $\delta_1$, $\delta_2$, $\delta_3$, $\delta_4$ in the X and Y axes in the plane of the substrate or piezoelectric film in different corners of the FBAR. The width of the raised frame 160 may linearly vary between the different widths at each corner along the sides of the FBAR. The width of the recessed frame 155 (ReW) may be constant about the active area 150. The central region/active area 150 may thus vary in width along both the X and Y axes of the FBAR, which will make it difficult for any spurious transverse waves to establish resonance or standing waves in the central region/active area 150.

Figure 3A:
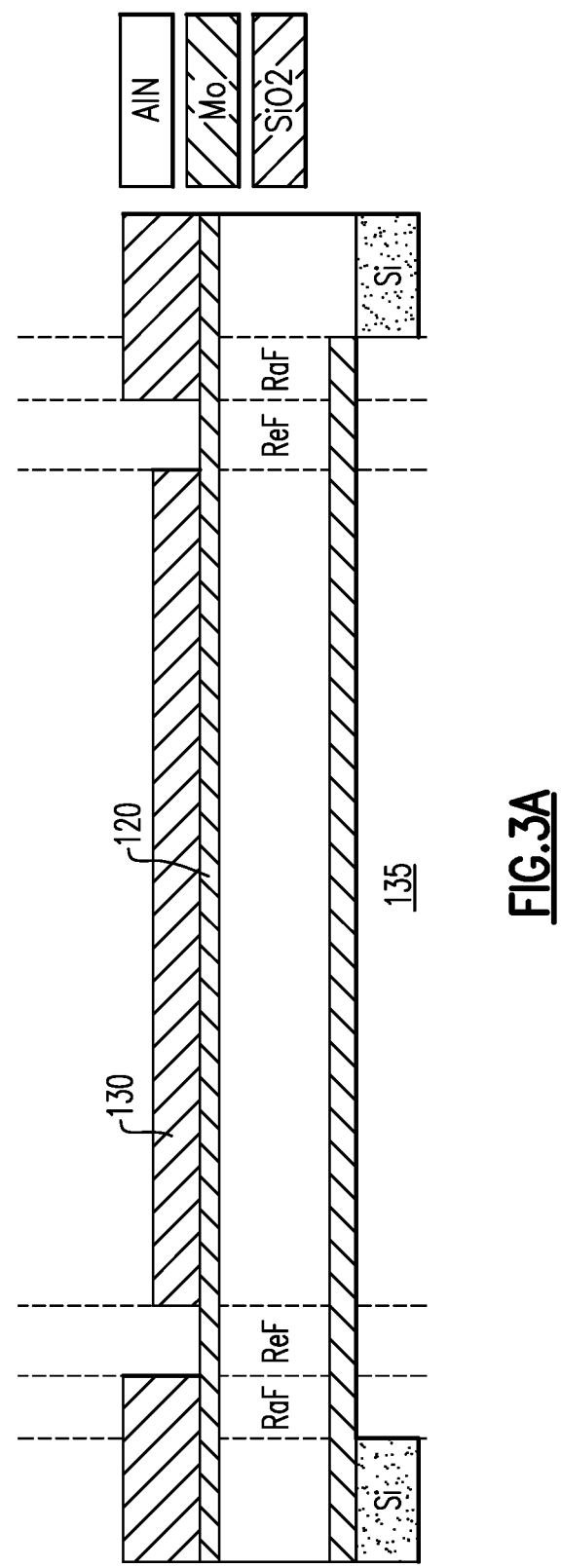
FIG. 3A illustrates a film bulk acoustic wave resonator configuration in which the recessed and raised frame regions are defined by changes in thickness of dielectric material on the top of the piezoelectric film.
Figure 3B:
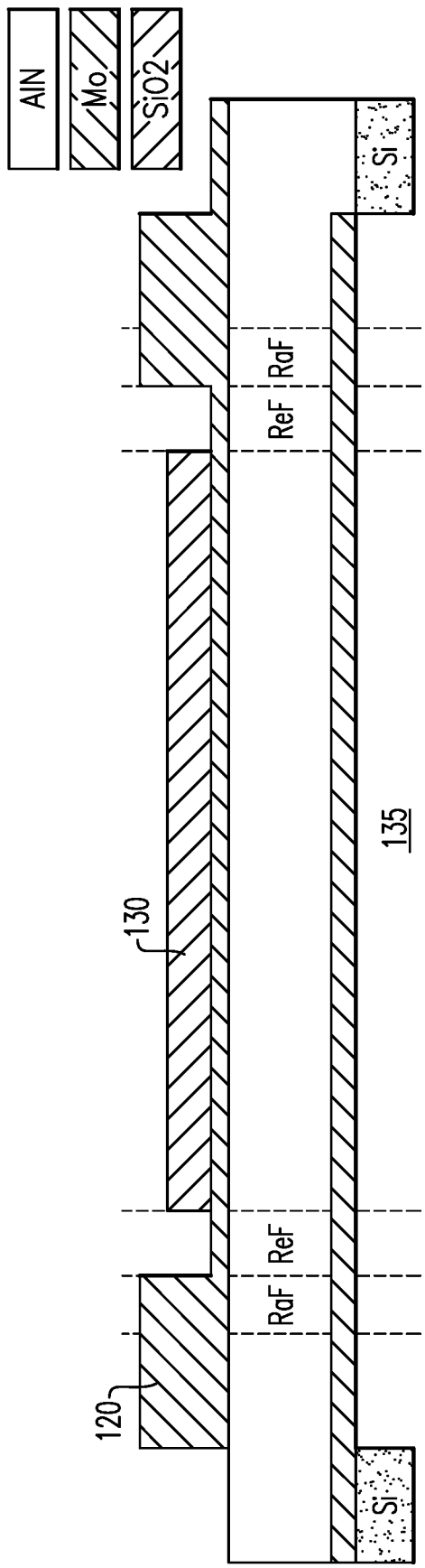
FIG. 3B illustrates a film bulk acoustic wave resonator configuration in which the recessed and raised frame regions are defined by changes in thickness of the dielectric material and the electrode material on the top of the piezoelectric film.
Figure 3C:
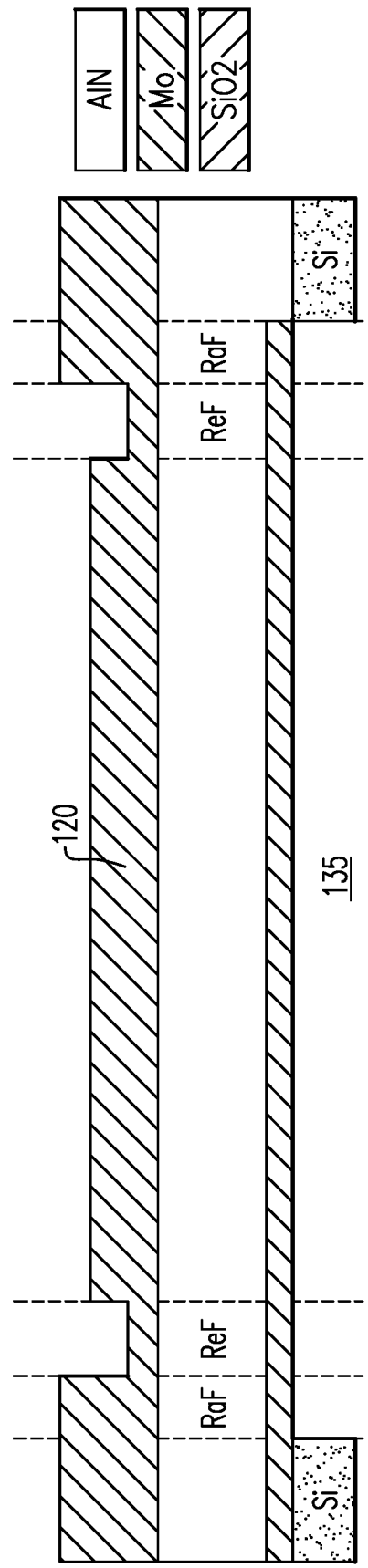
FIG. 3C illustrates a film bulk acoustic wave resonator configuration in which the recessed and raised frame regions are defined by changes in thickness of the electrode material on the top of the piezoelectric film.

As discussed above with reference to FIG. 1, the raised and recessed frame regions may be formed by changes in thickness of the electrode material 120 and/or dielectric material 130 on the top of the piezoelectric film 115 of a FBAR opposite the side of the piezoelectric film facing the cavity 135. FIG. 3A illustrates how the recessed and raised frame regions may be defined by changes in thickness of the dielectric material 130 (for example, $SiO_2$) on the top of the piezoelectric film 115. FIG. 3B illustrates how the recessed and raised frame regions may be defined by changes in thickness of the dielectric material 130 (for example, $SiO_2$) and the electrode material 120 on the top of the piezoelectric film 115. FIG. 3C illustrates how the recessed and raised frame regions may be defined by changes in thickness of the electrode material 120 on the top of the piezoelectric film 115. In other embodiments, the dielectric material of FIG. 3A or 3B could be replaced by or supplemented with any other layer or material that imparts the benefit realizing a different acoustic resonance condition relative to the center of the resonator.

Figure 4C:
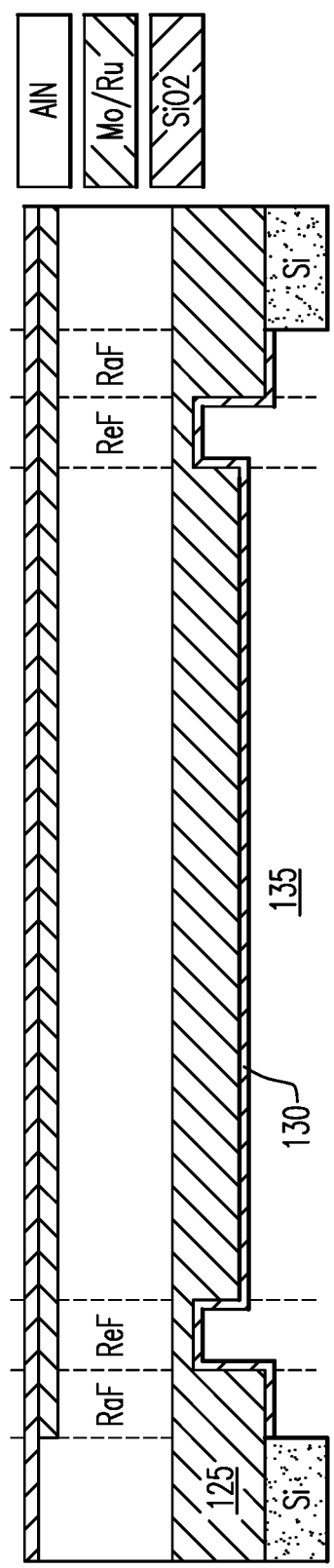
FIG. 4C illustrates a film bulk acoustic wave resonator configuration in which the recessed and raised frame regions are defined by changes in thickness of the electrode material on the bottom of the piezoelectric film.

In other embodiments, the raised frame regions and recessed frame regions may be defined by changes in thickness of the electrode material 120 and/or dielectric material 130 (for example, $SiO_2$) on the bottom side of the piezoelectric film facing the cavity 135. FIG. 4A illustrates a film bulk acoustic wave resonator configuration in which the recessed and raised frame regions may be defined by changes in thickness of dielectric material 130 on the bottom of the piezoelectric film. FIG. 4B illustrates a film bulk acoustic wave resonator configuration in which the recessed and raised frame regions may be defined by changes in thickness of the dielectric material and the electrode material on the bottom of the piezoelectric film. FIG. 4C illustrates a film bulk acoustic wave resonator configuration in which the recessed and raised frame regions may be defined by changes in thickness of the electrode material on the bottom of the piezoelectric film. In other embodiments, the dielectric material 130 of FIG. 4A or 4B could be replaced by or supplemented with any other layer or material that imparts the benefit realizing a different acoustic resonance condition relative to the center of the resonator.

Figure 5:
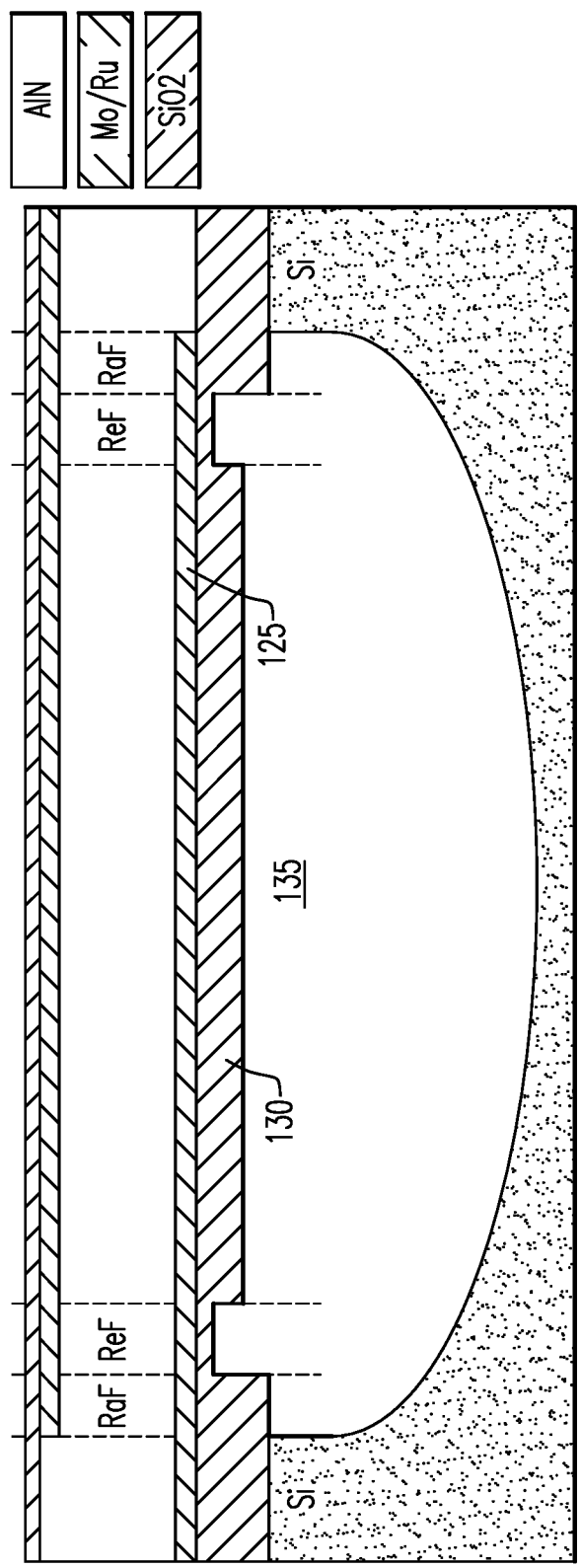
FIG. 5 illustrates an example of a film bulk acoustic wave resonator with the recessed and raised frames are defined on the bottom of the piezoelectric film by changes in the thickness of the lower side dielectric layer and having an active area disposed over a cavity defined by substrate etched to form a "swimming pool" structure.

In some embodiments, instead of forming a FBAR with a mesa structure as illustrated in FIG. 1 in which the piezoelectric film 115 rises up from the substrate 110 to form the flat active area 150 over the cavity 135, a FBAR may be formed with a substantially planar piezoelectric material film 115 and the cavity 135 may be defined by etching a portion of the substrate 110 below the piezoelectric film 115 to form a "swimming pool" type cavity structure. FIG. 5 illustrates an example of a FBAR with the recessed and raised frames defined on the bottom of the piezoelectric film by changes in the thickness of the lower side dielectric layer and having an active area disposed over a cavity 135 defined by substrate etched to form a "swimming pool" structure. The FBAR of FIG. 5 may be more reliable than FBARs having a mesa structure such as the FBAR illustrated in FIG. 1. The formation of the piezoelectric layer 115 with the different orientations in a mesa structure may lead to crystallographic defects in the material of the piezoelectric layer 115 that may degrade device performance. Forming a planar piezoelectric layer, as in the embodiment illustrated in FIG. 5, may help avoid such crystallographic defects. In other embodiments, the dielectric material 130 of FIG. 5 could be replaced by or supplemented with any other layer or material that imparts the benefit realizing a different acoustic resonance condition relative to the center of the resonator.

Figure 6A:
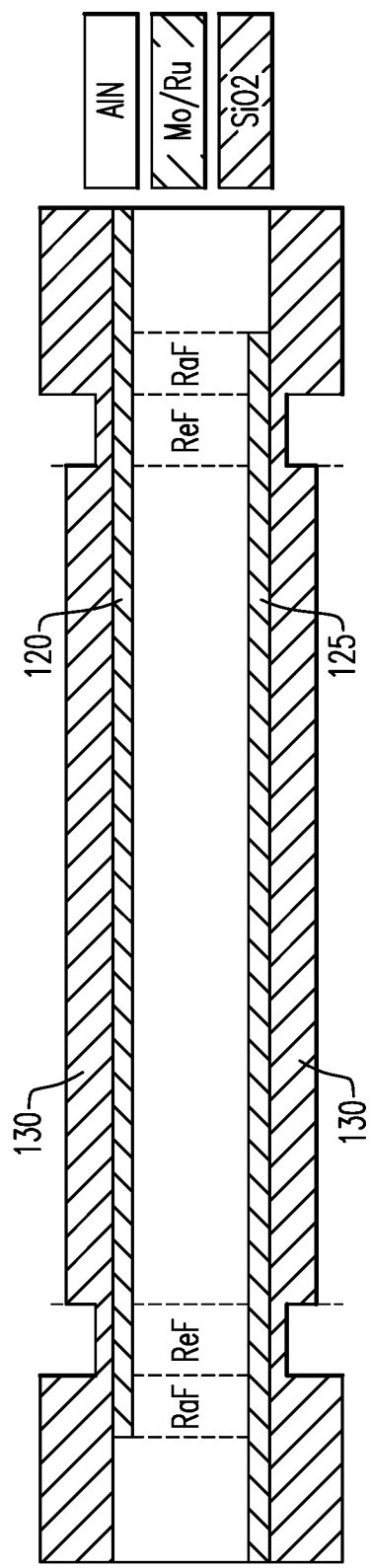
FIG. 6A illustrates a illustrates a film bulk acoustic wave resonator configuration in which the recessed and raised frame regions are defined by changes in thickness of the dielectric material on the bottom and top of the piezoelectric film.
Figure 6B:
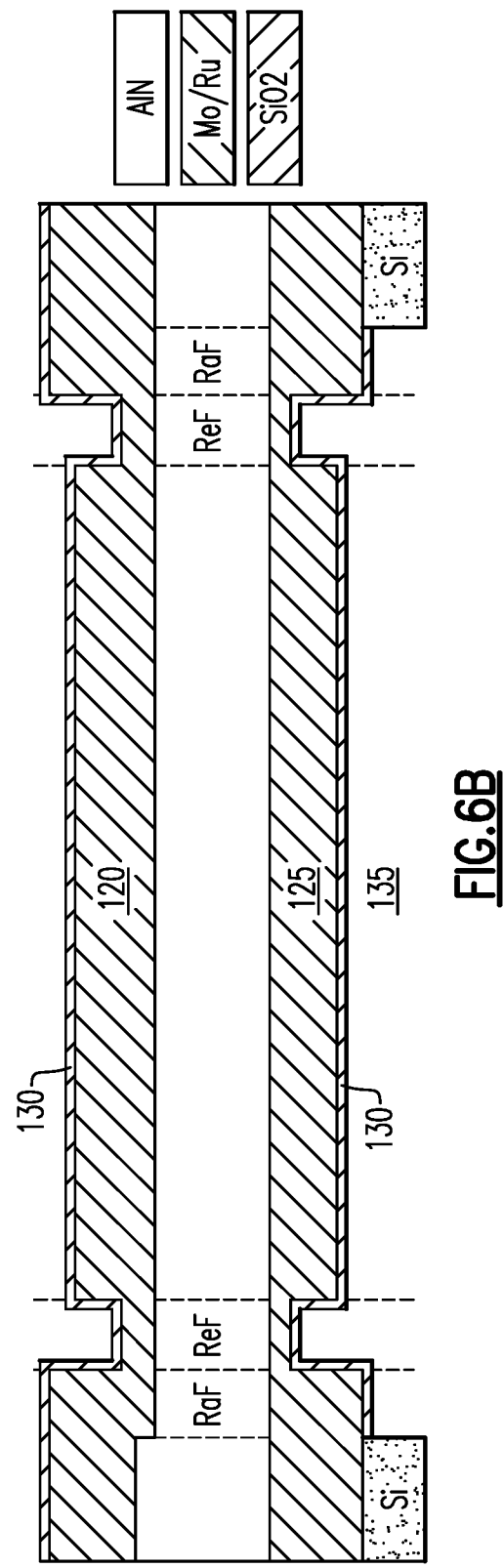
FIG. 6B illustrates a illustrates a film bulk acoustic wave resonator configuration in which the recessed and raised frame regions are defined by changes in thickness of the electrode material on the bottom and top of the piezoelectric film.

In further embodiments the raised and recessed frame structures of an FBAR may be formed on both the top and bottom of the piezoelectric film. FIG. 6A illustrates an example of an FBAR structure in which the raised and recessed frames are defined by different thicknesses of dielectric on both the upper and lower surfaces of the piezoelectric film. In other embodiments, the dielectric material of FIG. 6A could be replaced by or supplemented with any other layer or material that imparts the benefit realizing a different acoustic resonance condition relative to the center of the resonator. FIG. 6B illustrates an example of an FBAR structure in which the raised and recessed frames are defined by different thicknesses of the electrode material on both the upper and lower surfaces of the piezoelectric film.

Figure 7:
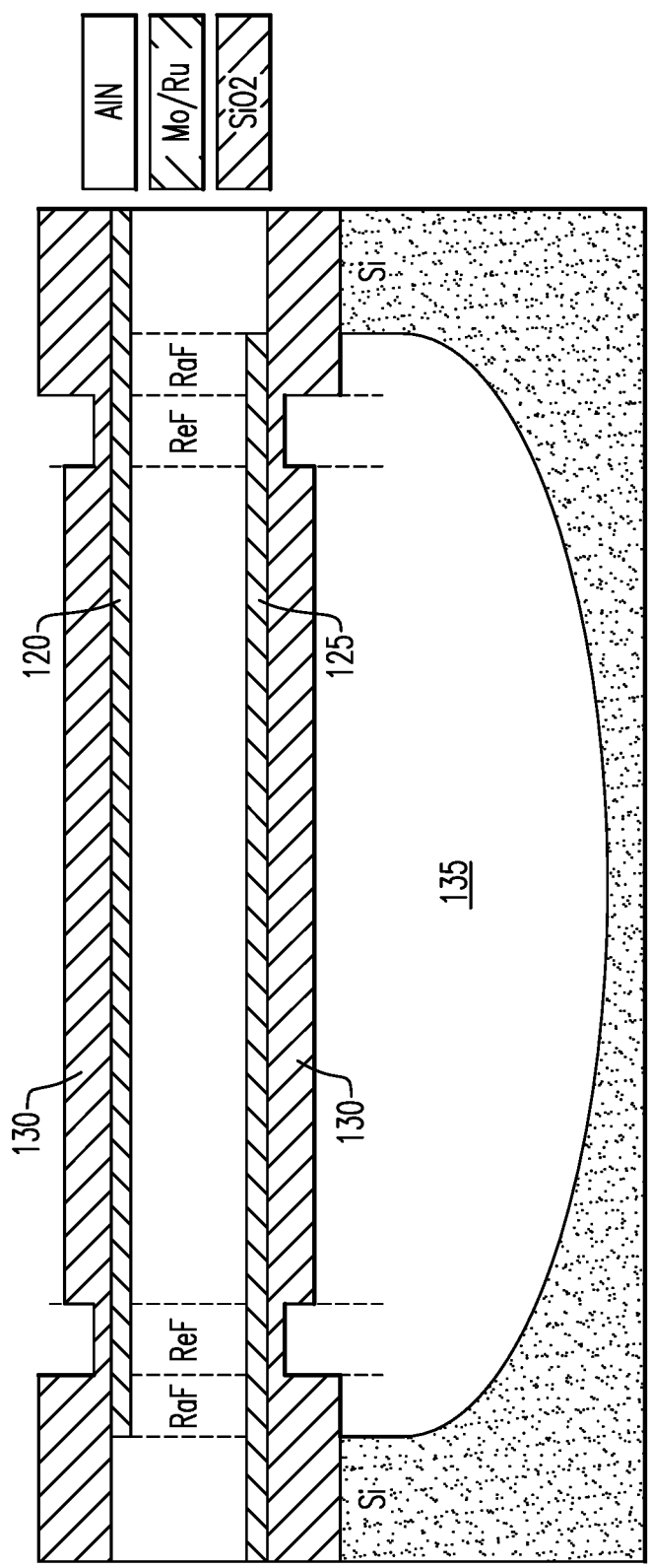
FIG. 7 illustrates the film bulk acoustic wave resonator configuration of FIG. 6A disposed over a cavity in a substrate etched to form a "swimming pool" cavity structure.

An FBAR in which the raised and recessed frame structures of an FBAR may be formed on both the top and bottom of the piezoelectric film may also be disposed on a substrate in which the cavity 135 is formed as a swimming pool structure by etching of the substrate. FIG. 7 illustrates an example of an FBAR structure including a substrate having a swimming pool type cavity 135 in which the raised and recessed frames are defined by different thicknesses of dielectric on both the upper and lower surfaces of the piezoelectric film. A FBAR structure in which the raised and recessed frames are defined by different thicknesses of the electrode material on both the upper and lower surfaces of the piezoelectric film such as illustrated in FIG. 6B could also include a substrate having a swimming pool type cavity 135 as illustrated in FIG. 7.

Figure 8:
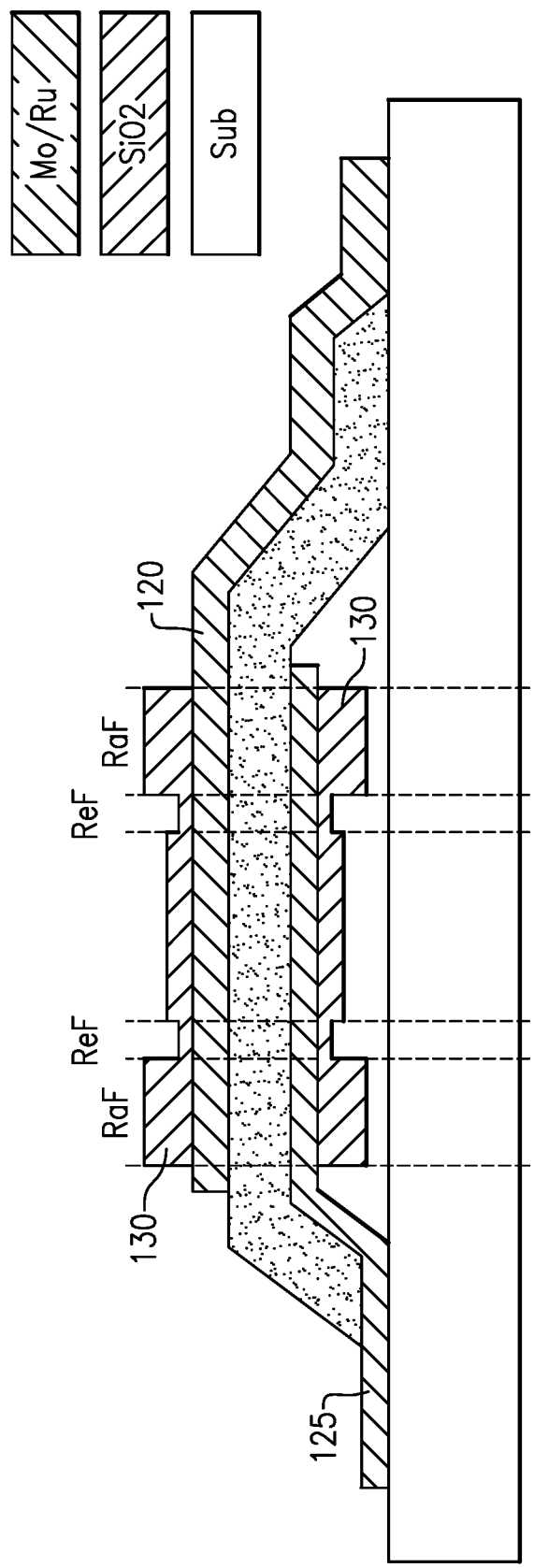
FIG. 8 illustrates a mesa type film bulk acoustic wave resonator configuration in which the recessed and raised frame regions are defined by changes in thickness of the dielectric material on the bottom and top of the piezoelectric film.

Any embodiments of FBAR structures disclosed herein in which the raised and recessed frames are defined by different thicknesses of the electrode material or dielectric material on both the upper and lower surfaces of the piezoelectric film may also be used to modify the mesa type FBAR illustrated in FIG. 1. FIG. 8 illustrates a simplified example of a mesa type FBAR having the raised and recessed frames defined by areas of dielectric material having different thicknesses on both the upper and lower sides of the piezoelectric film. The example of FIG. 8 could be modified such that the raised and recessed frames are defined by areas of electrode material having different thicknesses on both the upper and lower sides of the piezoelectric film. In other embodiments, the dielectric material 130 of FIG. 8 could be replaced by or supplemented with any other layer or material that imparts the benefit realizing a different acoustic resonance condition relative to the center of the resonator.

Figure 9A:
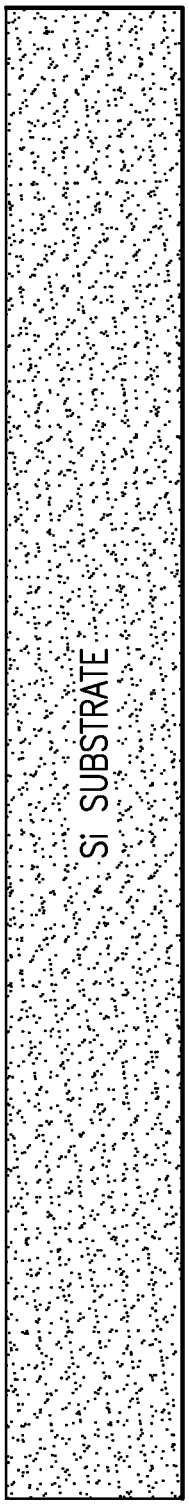
Figure 9B:
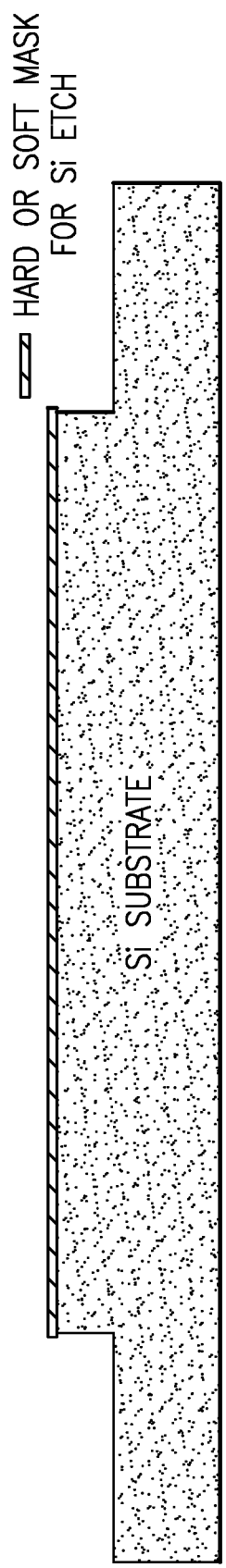
Figure 9C:
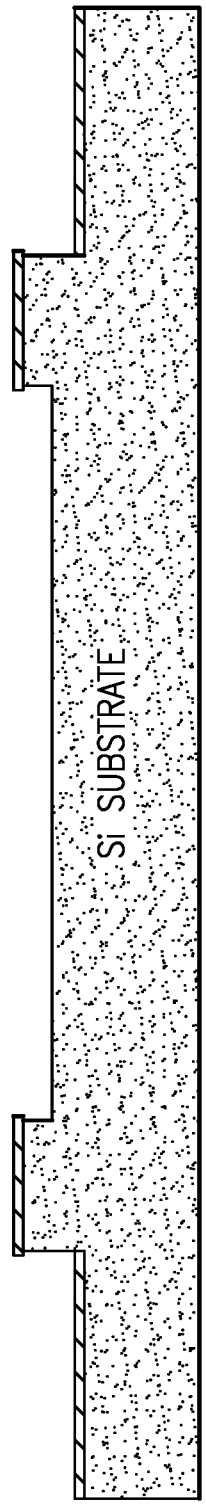
Figure 9I:
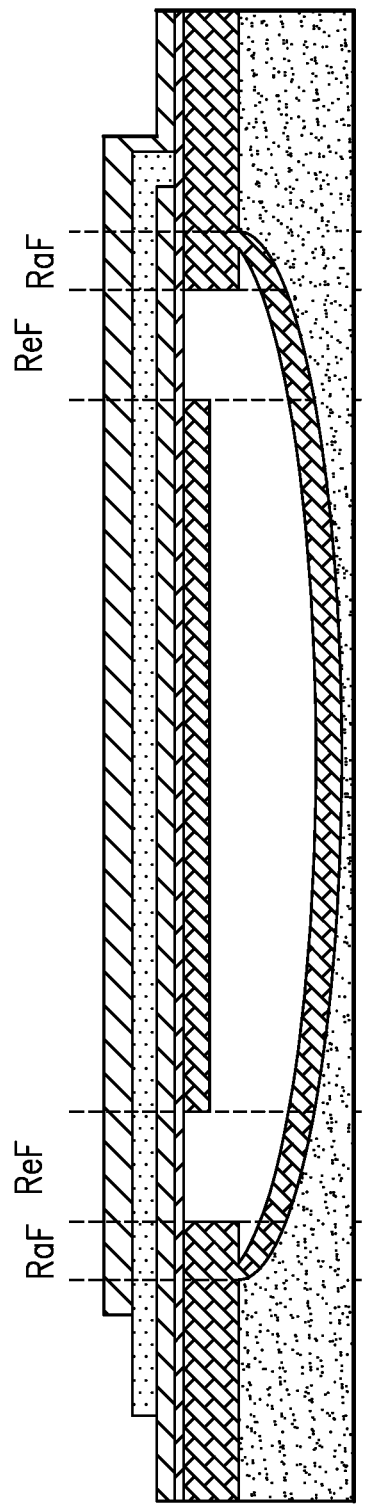

FIGS. 9A-9I illustrate a process flow for forming a film bulk acoustic wave resonator in accordance with an embodiment disclosed herein. The process may begin by providing a silicon substrate as shown in FIG. 9A. A hard or soft mask, for example, photoresist or a dielectric material is then deposited and patterned on the silicon substrate and the silicon substrate is etched to define areas for the raised frame regions (FIG. 9B). Another hard or soft mask is then deposited and patterned and the substrate is etched to define areas for the recessed frame regions (FIG. 9C). The masks are removed and a layer of passivation material, for example, $SiO_2$, SiN, etc., is deposited over the top of the substrate (FIG. 9D). The passivation material is then polished by CMP to expose the silicon of the substrate at the recessed frame areas (FIG. 9E). A thin layer of etch stop material is deposited and the bottom electrode material is deposited over the etch stop material and patterned (FIG. 9F). The piezoelectric material film is grown on top of the bottom electrode and patterned (FIG. 9G). The top electrode is deposited on top of the piezoelectric material and patterned (FIG. 9H). As discussed above, the top electrode may be formed with a greater thickness than the bottom electrode. The substrate beneath the active area of the piezoelectric film is the etched, for example, by introducing a silicon etching plasma through holes in the piezoelectric material and electrode layers (not shown) to define a cavity beneath the active area (FIG. 9I). An oxide layer may be grown on the silicon defining the bottom of the cavity. Additional process steps could be utilized to form recessed and raised frames on top of the piezoelectric layer by depositing and patterning additional top electrode metal and/or dielectric material on top of the upper electrode using deposition, patterning, and etching processes known in the art to arrive at other structures such as disclosed above.

It should be appreciated that the FBARs illustrated in the figures presented herein are illustrated in a highly simplified form. The relative dimensions of the different features are not shown to scale. Further, typical FBARs may include additional features or layers not illustrated.

Figure 10:
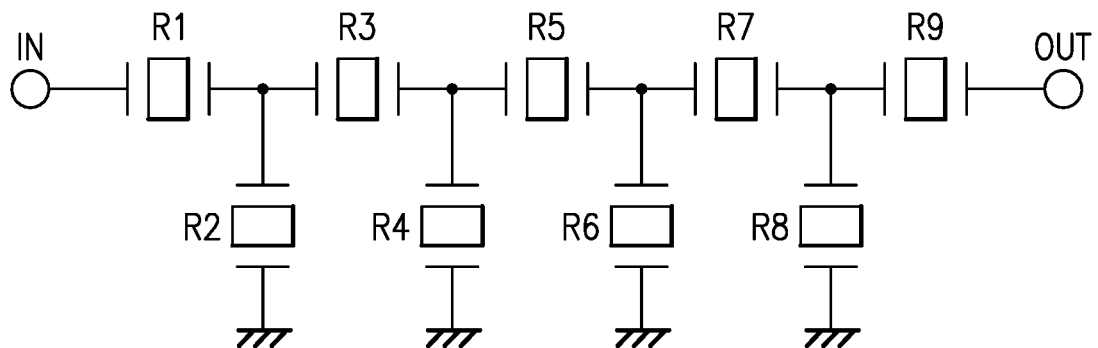
FIG. 10 is a schematic diagram of a radio frequency ladder filter.

In some embodiments, multiple FBARs as disclosed herein may be combined into a filter, for example, an RF ladder filter schematically illustrated in FIG. 10 and including a plurality of series resonators R1, R3, R5, R7, and R9, and a plurality of parallel (or shunt) resonators R2, R4, R6, and R8. As shown, the plurality of series resonators R1, R3, R5, R7, and R9 are connected in series between the input and the output of the RF ladder filter, and the plurality of parallel resonators R2, R4, R6, and R8 are respectively connected between series resonators and ground in a shunt configuration. Other filter structures and other circuit structures known in the art that may include FBAR devices or resonators, for example, duplexers, baluns, etc., may also be formed including examples of FBAR resonators as disclosed herein.

Figure 11:
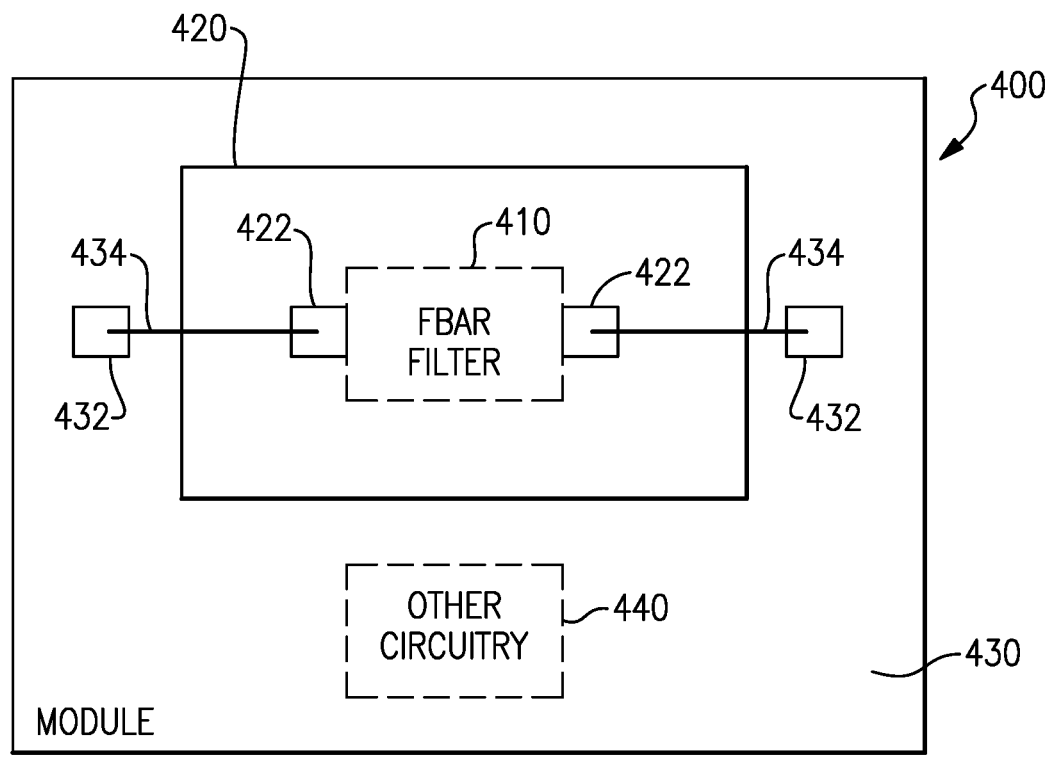
FIG. 11 is a block diagram of one example of a filter module that can include one or more acoustic wave elements according to aspects of the present disclosure.
Figure 12:
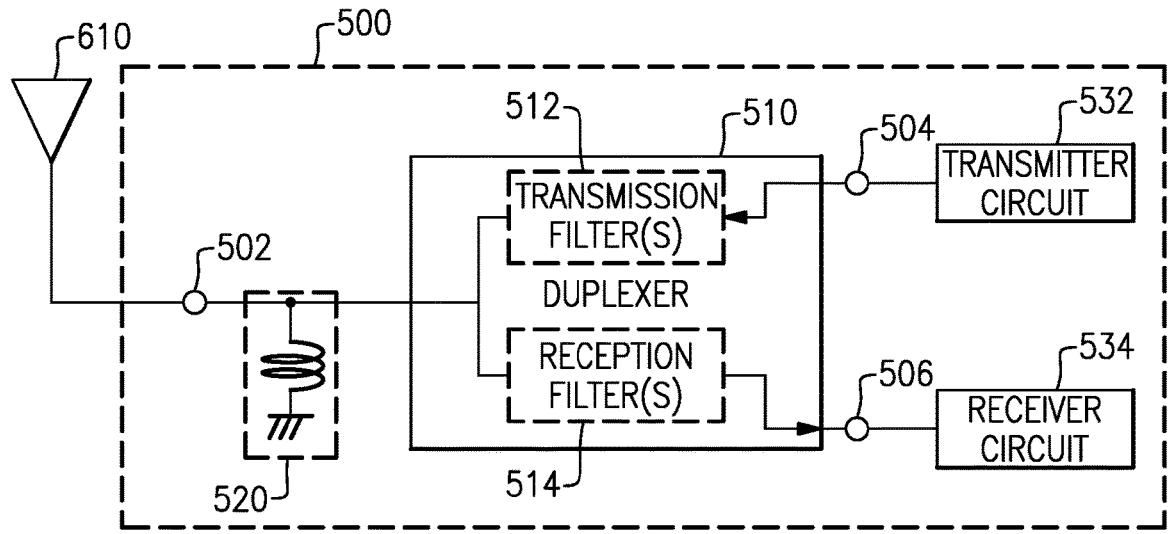
FIG. 12 is a block diagram of one example of a front-end module that can include one or more filter modules according to aspects of the present disclosure.
Figure 13:
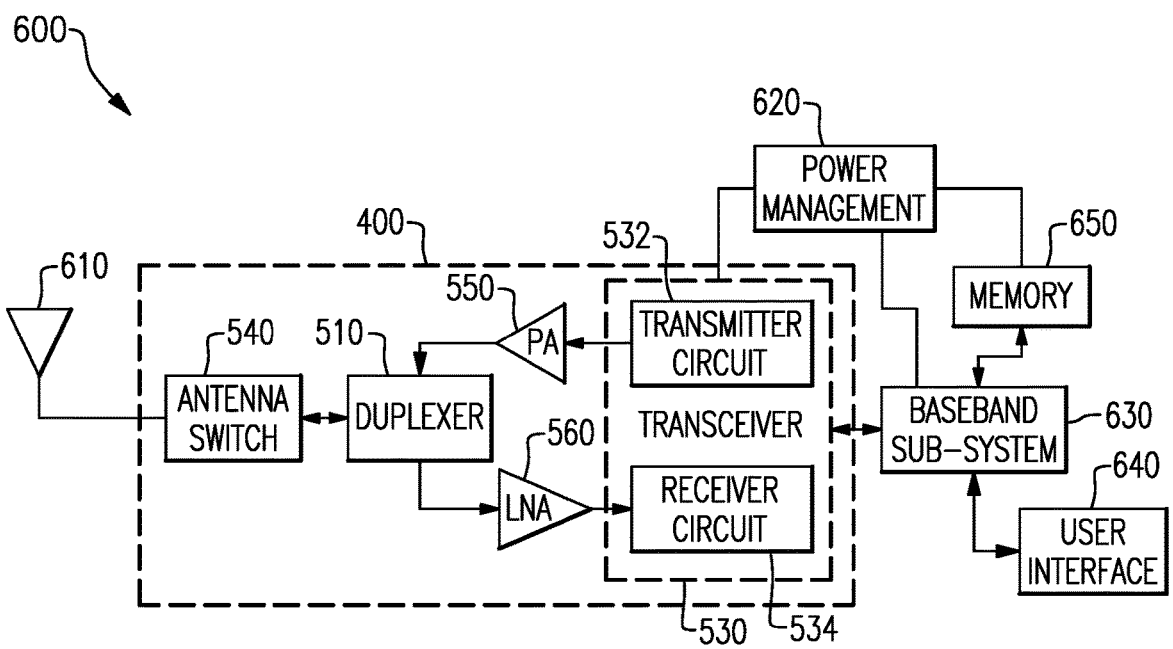
FIG. 13 is a block diagram of one example of a wireless device including the front-end module of FIG. 12.

The acoustic wave devices discussed herein can be implemented in a variety of packaged modules. Some example packaged modules will now be discussed in which any suitable principles and advantages of the packaged acoustic wave devices discussed herein can be implemented. FIGS. 11, 12, and 13 are schematic block diagrams of illustrative packaged modules and devices according to certain embodiments.

As discussed above, embodiments of the disclosed FBARs can be configured as or used in filters, for example. In turn, a FBAR filter using one or more FBAR elements may be incorporated into and packaged as a module that may ultimately be used in an electronic device, such as a wireless communications device, for example. FIG. 11 is a block diagram illustrating one example of a module 400 including a FBAR filter 410. The FBAR filter 410 may be implemented on one or more die(s) 420 including one or more connection pads 422. For example, the FBAR filter 410 may include a connection pad 422 that corresponds to an input contact for the FBAR filter and another connection pad 422 that corresponds to an output contact for the FBAR filter. The packaged module 400 includes a packaging substrate 430 that is configured to receive a plurality of components, including the die 420. A plurality of connection pads 432 can be disposed on the packaging substrate 430, and the various connection pads 422 of the FBAR filter die 420 can be connected to the connection pads 432 on the packaging substrate 430 via electrical connectors 434, which can be solder bumps or wirebonds, for example, to allow for passing of various signals to and from the FBAR filter 410. The module 400 may optionally further include other circuitry die 440, such as, for example, one or more additional filter(s), amplifiers, pre-filters, modulators, demodulators, down converters, and the like, as would be known to one of skill in the art of semiconductor fabrication in view of the disclosure herein. In some embodiments, the module 400 can also include one or more packaging structures to, for example, provide protection and facilitate easier handling of the module 400. Such a packaging structure can include an overmold formed over the packaging substrate 430 and dimensioned to substantially encapsulate the various circuits and components thereon.

Various examples and embodiments of the FBAR filter 410 can be used in a wide variety of electronic devices. For example, the FBAR filter 410 can be used in an antenna duplexer, which itself can be incorporated into a variety of electronic devices, such as RF front-end modules and communication devices.

Referring to FIG. 12, there is illustrated a block diagram of one example of a front-end module 500, which may be used in an electronic device such as a wireless communications device (e.g., a mobile phone) for example. The front-end module 500 includes an antenna duplexer 510 having a common node 502, an input node 504, and an output node 506. An antenna 610 is connected to the common node 502.

The antenna duplexer 510 may include one or more transmission filters 512 connected between the input node 504 and the common node 502, and one or more reception filters 514 connected between the common node 502 and the output node 506. The passband(s) of the transmission filter(s) are different from the passband(s) of the reception filter(s). Examples of the FBAR filter 410 can be used to form the transmission filter(s) 512 and/or the reception filter(s) 514. An inductor or other matching component 520 may be connected at the common node 502.

The front-end module 500 further includes a transmitter circuit 532 connected to the input node 504 of the duplexer 510 and a receiver circuit 534 connected to the output node 506 of the duplexer 510. The transmitter circuit 532 can generate signals for transmission via the antenna 610, and the receiver circuit 534 can receive and process signals received via the antenna 610. In some embodiments, the receiver and transmitter circuits are implemented as separate components, as shown in FIG. 12, however in other embodiments these components may be integrated into a common transceiver circuit or module. As will be appreciated by those skilled in the art, the front-end module 500 may include other components that are not illustrated in FIG. 12 including, but not limited to, switches, electromagnetic couplers, amplifiers, processors, and the like.

FIG. 13 is a block diagram of one example of a wireless device 600 including the antenna duplexer 510 shown in FIG. 12. The wireless device 600 can be a cellular phone, smart phone, tablet, modem, communication network or any other portable or non-portable device configured for voice or data communication. The wireless device 600 can receive and transmit signals from the antenna 610. The wireless device includes an embodiment of a front-end module 500 similar to that discussed above with reference to FIG. 12. The front-end module 500 includes the duplexer 510, as discussed above. In the example shown in FIG. 13 the front-end module 500 further includes an antenna switch 540, which can be configured to switch between different frequency bands or modes, such as transmit and receive modes, for example. In the example illustrated in FIG. 13, the antenna switch 540 is positioned between the duplexer 510 and the antenna 610; however, in other examples the duplexer 510 can be positioned between the antenna switch 540 and the antenna 610. In other examples the antenna switch 540 and the duplexer 510 can be integrated into a single component.

The front-end module 500 includes a transceiver 530 that is configured to generate signals for transmission or to process received signals. The transceiver 530 can include the transmitter circuit 532, which can be connected to the input node 504 of the duplexer 510, and the receiver circuit 534, which can be connected to the output node 506 of the duplexer 510, as shown in the example of FIG. 12.

Signals generated for transmission by the transmitter circuit 532 are received by a power amplifier (PA) module 550, which amplifies the generated signals from the transceiver 530. The power amplifier module 550 can include one or more power amplifiers. The power amplifier module 550 can be used to amplify a wide variety of RF or other frequency-band transmission signals. For example, the power amplifier module 550 can receive an enable signal that can be used to pulse the output of the power amplifier to aid in transmitting a wireless local area network (WLAN) signal or any other suitable pulsed signal. The power amplifier module 550 can be configured to amplify any of a variety of types of signal, including, for example, a Global System for Mobile (GSM) signal, a code division multiple access (CDMA) signal, a W-CDMA signal, a Long-Term Evolution (LTE) signal, or an EDGE signal. In certain embodiments, the power amplifier module 550 and associated components including switches and the like can be fabricated on gallium arsenide (GaAs) substrates using, for example, high-electron mobility transistors (pHEMT) or insulated-gate bipolar transistors (BiFET), or on a Silicon substrate using complementary metal-oxide semiconductor (CMOS) field effect transistors.

Still referring to FIG. 13, the front-end module 500 may further include a low noise amplifier module 560, which amplifies received signals from the antenna 610 and provides the amplified signals to the receiver circuit 534 of the transceiver 530.

The wireless device 600 of FIG. 13 further includes a power management sub-system 620 that is connected to the transceiver 530 and manages the power for the operation of the wireless device 600. The power management system 620 can also control the operation of a baseband sub-system 630 and various other components of the wireless device 600. The power management system 620 can include, or can be connected to, a battery (not shown) that supplies power for the various components of the wireless device 600. The power management system 620 can further include one or more processors or controllers that can control the transmission of signals, for example. In one embodiment, the baseband sub-system 630 is connected to a user interface 640 to facilitate various input and output of voice and/or data provided to and received from the user. The baseband sub-system 630 can also be connected to memory 650 that is configured to store data and/or instructions to facilitate the operation of the wireless device, and/or to provide storage of information for the user. Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a range from about 30 kHz to 300 GHz, such as in a range from about 450 MHz to 6 GHz.

Aspects of this disclosure can be implemented in various electronic devices. Examples of the electronic devices can include, but are not limited to, consumer electronic products, parts of the consumer electronic products such as packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a stereo system, a digital music player, a radio, a camera such as a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A film bulk acoustic wave resonator comprising:
   a piezoelectric film having a central region defining a main active domain in which a main acoustic wave is generated during operation;
   an upper electrode disposed on a top surface of the piezoelectric film;
   a lower electrode disposed on a lower surface of the piezoelectric film;
   a dielectric material layer disposed on a lower surface of the lower electrode;
   a carrier substrate disposed below a lower surface of the dielectric material layer;
   lower recessed frame regions disposed laterally on opposite sides of the central region, the dielectric material layer disposed on the lower surface of the lower electrode throughout the central region, the lower recessed frame regions, and throughout areas extending between the central region and the lower recessed frame regions, the lower recessed frame regions defined by regions of the dielectric material layer having a lesser thickness than a thickness of the dielectric material layer in the central region; and
   lower raised frame regions disposed laterally on opposite sides of the lower recessed frame regions from the central region, the lower raised frame regions defined by regions of the lower electrode having a greater thickness than a thickness of the lower electrode in the central region, the dielectric material layer extending throughout the lower raised frame regions and having a thickness in the lower raised frame regions less than the thickness of the dielectric material layer in the central region.

2. The film bulk acoustic wave resonator of claim 1 included in a radio frequency filter.

3. The film bulk acoustic wave resonator of claim 2 included in an electronic device module.

4. The film bulk acoustic wave resonator of claim 3 included in an electronic device.

5. The film bulk acoustic wave resonator of claim 1 wherein widths of the lower raised frame regions are linearly apodized across a width of the film bulk acoustic wave resonator in a plane defined by the top surface of the piezoelectric film.

6. The film bulk acoustic wave resonator of claim 5 wherein apodization of the lower raised frame regions is between first and second widths on both of a first side of the film bulk acoustic wave resonator and on a second side of the film bulk acoustic wave resonator opposite the first side.

7. The film bulk acoustic wave resonator of claim 5 wherein apodization of the lower raised frame regions is between first and second widths on a first side of the film bulk acoustic wave resonator and between third and fourth widths on a second side of the film bulk acoustic wave resonator opposite the first side, at least one of the third and fourth widths being different from each of the first and second widths.

8. The film bulk acoustic wave resonator of claim 1 wherein widths of the lower recessed frame regions are linearly apodized across a width of the film bulk acoustic wave resonator in a plane defined by the top surface of the piezoelectric film.

9. The film bulk acoustic wave resonator of claim 8 wherein apodization of the lower recessed frame regions is between first and second widths on both of a first side of the film bulk acoustic wave resonator and on a second side of the film bulk acoustic wave resonator opposite the first side.

10. The film bulk acoustic wave resonator of claim 8 wherein apodization of the lower recessed frame regions is between first and second widths on a first side of the film bulk acoustic wave resonator and between third and fourth widths on a second side of the film bulk acoustic wave resonator opposite the first side, at least one of the third and fourth widths being different from each of the first and second widths.

11. The film bulk acoustic wave resonator of claim 1 further comprising an upper dielectric material layer disposed on an upper surface of the upper electrode and upper recessed frame regions including regions of the upper dielectric material layer having a lesser thickness than a thickness of the upper dielectric material layer in the central region.

12. The film bulk acoustic wave resonator of claim 11 further comprising upper raised frame regions including regions of the upper dielectric material layer having a greater thickness than the thickness of the upper dielectric material layer in the central region.

13. The film bulk acoustic wave resonator of claim 1 wherein the thickness of the lower electrode in the lower raised frame regions is greater than the thickness of the lower electrode in the lower recessed frame regions and greater than the thickness of the lower electrode in the central region.

14. The film bulk acoustic wave resonator of claim 1 further comprising upper raised frame regions including regions of the upper electrode having a greater thickness than the thickness of the upper electrode in the central region.

15. The film bulk acoustic wave resonator of claim 1 further comprising an upper dielectric material disposed on an upper surface of the upper electrode, and upper raised frame regions including regions of the upper dielectric material having a greater thickness than a thickness of the upper dielectric material in the central region.

16. A film bulk acoustic wave resonator comprising:
a piezoelectric film having a central region defining a main active domain in which a main acoustic wave is generated during operation;
an upper electrode disposed on a top surface of the piezoelectric film;
a lower electrode disposed on a lower surface of the piezoelectric film;
a dielectric material layer disposed on a lower surface of the lower electrode;
a carrier substrate disposed below the lower surface of the dielectric material layer;
lower recessed frame regions disposed laterally on opposite sides of the central region, the dielectric material layer disposed on the lower surface of the lower electrode throughout the central region, the lower recessed frame regions, and throughout areas extending between the central region and the lower recessed frame regions; and
lower raised frame regions disposed laterally on opposite sides of the lower recessed frame regions from the central region, the lower raised frame regions defined by regions of the lower electrode having a greater thickness than a thickness of the lower electrode in the central region, the dielectric material layer extending throughout the lower raised frame regions and having a thickness in the lower raised frame regions less than the thickness of the dielectric material layer in the central region.

17. The film bulk acoustic wave resonator of claim 16 wherein the lower recessed frame regions are defined by regions of one of the dielectric material layer having a lesser thickness than the thickness of the dielectric material layer in the central region or of the lower electrode having a lesser thickness than a thickness of the lower electrode in the central region.

* * * * *